United States Patent
Vashchenko et al.

(10) Patent No.: US 7,027,278 B1
(45) Date of Patent: Apr. 11, 2006

(54) STACKED HIGH-VOLTAGE ESD PROTECTION CLAMP WITH TRIGGERING VOLTAGE CIRCUIT CONTROL

(75) Inventors: Vladislav Vashchenko, Palo Alto, CA (US); Peter J. Hopper, San Jose, CA (US); Ann Concannon, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 16 days.

(21) Appl. No.: 10/897,063

(22) Filed: Jul. 22, 2004

(51) Int. Cl.
  *H02H 9/00* (2006.01)
(52) U.S. Cl. .................................................. 361/56
(58) Field of Classification Search .................... 361/56
  See application file for complete search history.

(56) References Cited

U.S. PATENT DOCUMENTS

| | | | |
|---|---|---|---|
| 5,959,820 A * | 9/1999 | Ker et al. ................... 361/111 |
| 6,091,594 A * | 7/2000 | Williamson et al. ........ 361/111 |
| 6,181,542 B1 * | 1/2001 | Liang et al. ................. 361/111 |
| 6,577,481 B1 * | 6/2003 | Steinhoff et al. ............. 361/56 |
| 6,768,616 B1 * | 7/2004 | Mergens et al. .............. 361/56 |
| 2005/0110574 A1 * | 5/2005 | Richard et al. ............. 330/297 |
| 2005/0155473 A1 * | 7/2005 | Gass ............................. 83/58 |

* cited by examiner

*Primary Examiner*—Ronald Leja
(74) *Attorney, Agent, or Firm*—Stallman & Pollock LLP

(57) ABSTRACT

A stacked high-voltage ESD protection clamp is provided that realizes the desired triggering characteristics of a BJT or BSCR stacked snapback clamp. The operational principle of the new circuit is based upon introduction of a middle node capacitor into the stacked (cascoded) clamp. The capacitor (or driver) provides conditions for a two-stage turn-on. At the beginning of an ESD pulse, the capacitor is discharged. With the ESD voltage increase, part of the current is used to charge the capacitor, thus shunting one of the BJTs (BSCRs). As a result, the other BJT (BSCR) will experience fast turn-on. After turn-on, the current provides a fast charge of the capacitor and the turn-on of the second device. Thus, the middle node capacitor allows the triggering characteristics of the clamp to be controlled.

2 Claims, 2 Drawing Sheets

STACKED HIGH-VOLTAGE ESD PROTECTION CLAMP WITH TRIGGERING VOLTAGE CIRCUIT CONTROL

FIELD OF THE INVENTION

The present invention relates to electrostatic discharge (ESD) protection circuits for integrated circuits. More particularly, the invention is directed to a high-voltage ESD protection clamp that realizes the desired triggering characteristics of a bipolar junction transistor (BJT) or bipolar silicon controlled rectifier (BSCR) stacked snapback clamp by introducing a middle node capacitor into a stacked (cascoded) clamp.

DESCRIPTION OF THE INVENTION

Figure 1A:
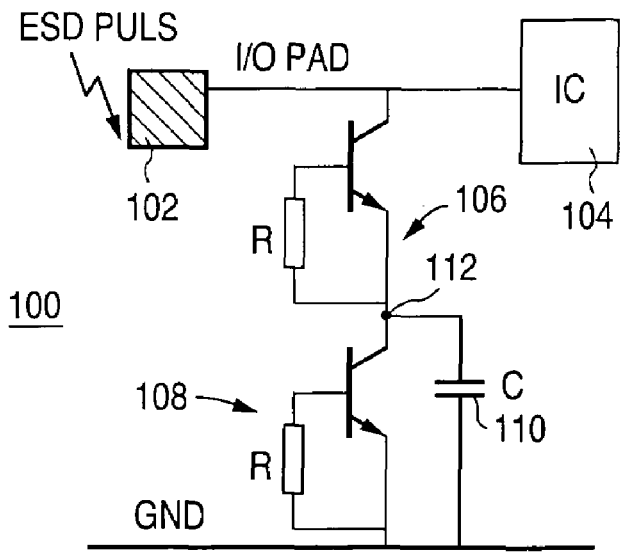
FIG. 1A is a schematic diagram illustrating an embodiment of a stacked bipolar junction transistor (BJT) high-voltage ESD power clamp circuit that utilizes middle node capacitance in accordance with the concepts of the present invention.

Integrated circuits are susceptible to electrostatic discharge. Given the decreasing physical size of integrated circuit features resulting from improved process technology, exposure to even a small amount of environmentally generated static electricity can cause many MOS circuits to fail.

An electrostatic discharge typically occurs when the circuit is touched by a person handling the circuit die before or after packaging, when a packaged integrated circuit slides on its pins over another surface, or generally whenever the circuit is exposed to static electricity. Damage from electrostatic discharge accounts for over half of the integrated circuits returned by customers.

Often, to realize high-voltage operation, stacked (cascoded) devices are used. When ESD protection is required, either an NPN BJT or an NPN BSCR can be used in the same stacked architecture. Both devices might provide the snapback operation.

A problem arises, however, in achieving the proper triggering characteristics of the final ESD clamp. Usually, the triggering-on voltage is desired to be higher than the power supply and lower than the snapback voltage of the "native" bipolar devices. This presents a challenge since both the "native" devices and the ESD devices use the same blocking junction regions, thus often providing very similar triggering characteristics in the power supply or open collector (drain) circuits.

There are a number of conventional solutions to this problem. The primary solution for BJT clamps is to use certain drivers based upon reference Zener diodes realized by different regions available in the circuit fabrication process. Another approach, which is more or less efficient for SCR-type devices, is to realize conditions for so-called dV/dt triggering. These solutions, however, are not always available and suffer from certain disadvantages. For example, they provide limited options to select the regions to provide proper breakdown voltage for reference junctions or avalanche (zener) diodes. Using dV/dt triggering can conflict with the specification for the circuit, particularly when the noise in the power supply might trigger the ESD device or when the high speed of the signal does not allow utilization of dV/dt.

The present invention relies on a different approach to control the triggering characteristics of the stacked clamps on the circuit level. In general, the triggering voltages of the clamp should be slightly reduced from the triggering level of the devices formed based on "native" blocking functions. The concepts of the invention are based upon two-stage fast triggering.

Those skilled in the art will appreciate that an integrated circuit die may include a number of operational integrated circuits, each with its respective operating voltage range, and each requiring its own ESD protection circuitry designed for protection of that specific operational circuit. It is not unusual for a large number of ESD protection clamps to be included in a given device architecture. Therefore, it is intended that the following description of the invention be exemplary, not limiting.

FIG. 1A shows a stacked BJT high-voltage ESD protection clamp 100 in accordance with the invention. The stacked BJT clamp is connected between an input/output (I/O) pad 102 of an operational integrated circuit 104 and the ground terminal GND. The circuit 100 includes a first BJT device 106 and a second cascoded BJT device 108. A capacitor 110 is connected between the middle node 112 of the stacked BJT devices 106, 108 and the ground terminal GND.

The operational principle of the FIG. 1A circuit is based upon the utilization of the middle node capacitor 110 in the stacked (cascoded) clamp 100. The capacitor (or driver) provides conditions for a two-stage turn-on. At the beginning of an ESD pulse at the I/O pad 102, the capacitor 110 is discharged. With increase in ESD voltage at the pad 102, part of the current is used to charge the middle node capacitor 110, thus shunting one of the BJTs. As a result, the other BJT will experience fast turn-on. After turn-on, the current provides a fast charge of the capacitor 110 and the turn-on of the second device. Thus, the middle node capacitor 110 allows the triggering characteristics of the clamp 100 to be controlled.

Those skilled in the art will appreciate, that, in this particular case, it is anticipated that the driver circuit will temporarily keep the middle node potential low, thus providing a consequent triggering of the cascoded devices. Instead of the high area capacitor that is needed to maintain the middle node at low voltage, an invertor-type or an amplifier-type circuit with a reference RC circuit might be used, if possible for a given process.

Figure 1B:
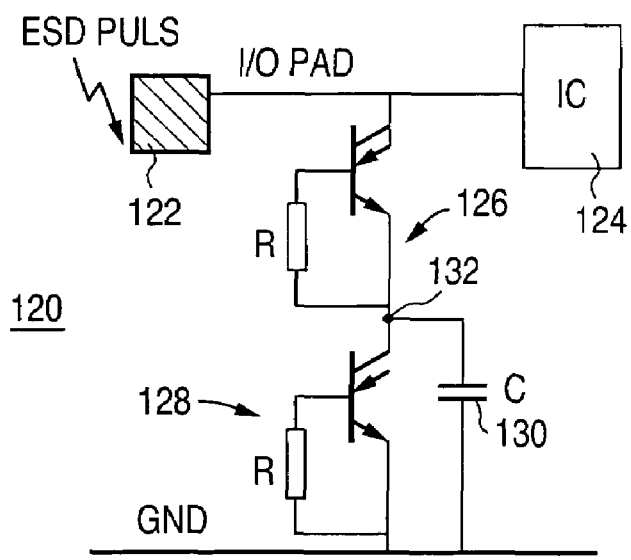
FIG. 1B is a schematic diagram illustrating an embodiment of a stacked bipolar silicon controlled rectifier (BSCR) high-voltage ESD power clamp circuit that utilizes middle node capacitance in accordance with the concepts of the present invention.

FIG. 1B shows a stacked BSCR ESD protection clamp 120 that implements the concepts discussed above. The BSCR clamp 120 is connected between an input/output (I/O) pad 122 of an operational integrated circuit 124 and the ground terminal GND. The clamp 120 includes a first BSCR device 126 and a second cascoded BSCR device 128. A capacitor 130 is connected between the middle node 132 of the stacked BSCR devices 126, 128 and the ground terminal GND.

The operating principles of the stacked BSCR clamp 120 are similar to those decribed above with respect to the FIG. 1A stacked BJT clamp 100.

Those skilled in the art will appreciate that in both of the embodiments of the invention described above, the middle node capacitor must have enough value to provide turn-on current for the first of the cascoded devices during the turn-on time. Of course, this depends upon the particular process and design used for a particular application. As indicated by the simulation results provided herein, the turn-on time is typically about 1–10 ns and the turn-on current is typically about 1–100 mA.

Figure 2:
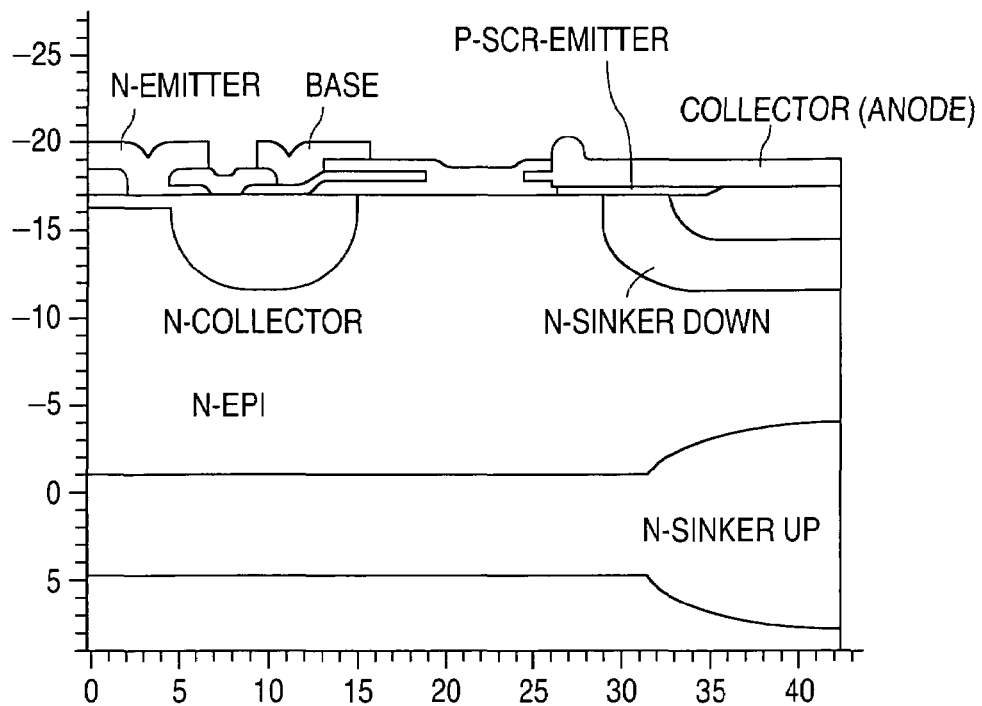
FIG. 2 is a partial cross-section drawing illustrating a reference BSCR device utilized in a stacked (two 2-D devices) mixed-mode simulation of the concepts of the present invention.
Figure 3:
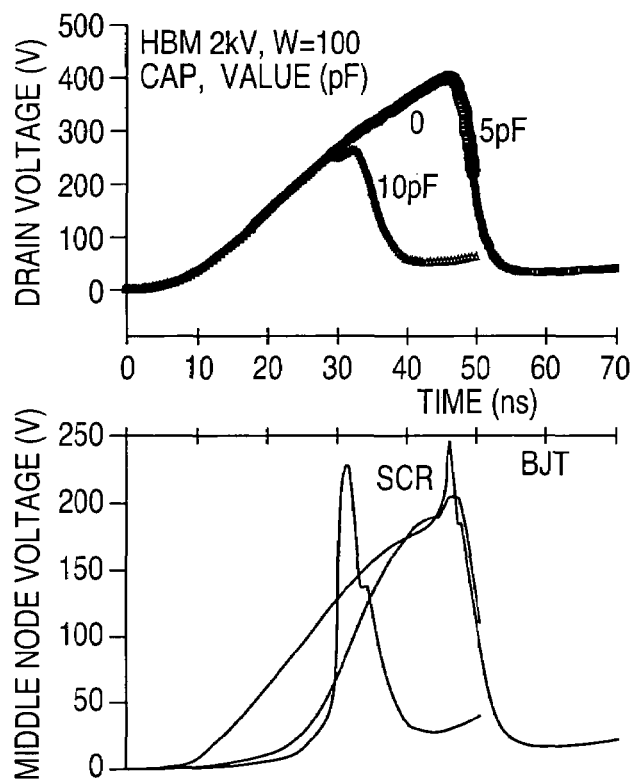
FIG. 3 provides graphs illustrating calculated waveforms for a cascoded BSCR high-voltage ESD power clamp in accordance with the present invention under different number capacitor values.

FIG. 2 provides a cross-sectional view of a stacked BSCR clamp utilized in simulating the concepts of the invention. FIG. 3 presents data regarding the technology computer aided design (TCAD) validation of the concepts discussed above. The simulated waveforms demonstrate a gradual reduction of the triggering voltage in terms of voltage overshoot as a function of middle node capacitor value. Thus, the disclosed ESD protection clamp presents a new approach to BSCR and NBJT stacked clamp design with a desired voltage range using "native" regions in the process.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A stacked bipolar junction transistor (BJT) ESD protection clamp for protecting an operational integrated circuit, the stacked BJT protection clamp comprising:
   a first BJT device and a second cascode-connected BJT device connected between an input/output pad of the operational integrated circuit and a negative voltage supply terminal, the first and second cascoded BJT devices defining a middle node therebetween; and
   a middle node capacitor connected between the middle node and the negative voltage supply terminal.

2. A stacked bipolar silicon controlled rectifier (BSCR) ESD protection clamp for protecting an operational integrated circuit, the stacked BSCR protection clamp comprising:
   a first BSCR device and a second cascode-connected BSCR device connected between an input/output pad of the operation circuit and a negative voltage supply terminal, the first and second cascoded BSCR devices defining a middle node therebetween; and
   a middle node capacitor connected between the middle node and the negative voltage supply terminal.

* * * * *